United States Patent
Lee et al.

(10) Patent No.: US 7,781,276 B2
(45) Date of Patent: Aug. 24, 2010

(54) METHODS OF FORMING CMOS INTEGRATED CIRCUITS THAT UTILIZE INSULATING LAYERS WITH HIGH STRESS CHARACTERISTICS TO IMPROVE NMOS AND PMOS TRANSISTOR CARRIER MOBILITIES

(75) Inventors: Kyoung-woo Lee, Seoul (KR); Ja-hum Ku, Gyeonggi-do (KR); Seung-man Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/353,519

(22) Filed: Jan. 14, 2009

(65) Prior Publication Data
US 2009/0124093 A1     May 14, 2009

Related U.S. Application Data

(62) Division of application No. 11/560,564, filed on Nov. 16, 2006, now abandoned.

(51) Int. Cl.
*H01L 21/337* (2006.01)

(52) U.S. Cl. ............... 438/188; 438/199; 257/229; 257/274; 257/E21.632; 257/E21.612; 257/E27.064

(58) Field of Classification Search .......... 438/188, 438/199, 223, 224; 257/213, 229, 274, 338, 257/574, E21.632, E21.612, E27.064
See application file for complete search history.

(56) References Cited

U.S. PATENT DOCUMENTS

| | | | |
|---|---|---|---|
| 5,731,617 | A | 3/1998 | Suda |
| 6,184,157 | B1 | 2/2001 | Hsu et al. |
| 6,372,589 | B1 | 4/2002 | Yu |
| 6,869,866 | B1 | 3/2005 | Chidambarrao et al. |
| 7,022,561 | B2 | 4/2006 | Huang et al. |
| 7,052,946 | B2 | 5/2006 | Chen et al. |
| 7,189,624 | B2 | 3/2007 | Ito |
| 7,297,584 | B2 | 11/2007 | Park et al. |
| 7,396,718 | B2 | 7/2008 | Frohberg et al. |
| 7,482,215 | B2 | 1/2009 | Dyer et al. |
| 7,534,678 | B2 | 5/2009 | Lee et al. |

(Continued)

FOREIGN PATENT DOCUMENTS

JP    6-163578    6/1994

(Continued)

OTHER PUBLICATIONS

Korean Office Action for Korean patent application No. 9-5-2007-056623522; Oct. 24, 2007.
U.S. Appl. No. 11/874,118, filed Oct. 17, 2007, Kim et al.
U.S. Appl. No. 11/831,223, filed Jul. 31, 2007, Nam et al.

*Primary Examiner*—Hsien-ming Lee
(74) *Attorney, Agent, or Firm*—Myers Bigel Sibley & Sajovec

(57) ABSTRACT

A CMOS integrated circuit has NMOS and PMOS transistors therein and an insulating layer extending on the NMOS transistors. The insulating layer is provided to impart a relatively large tensile stress to the NMOS transistors. In particular, the insulating layer is formed to have a sufficiently high internal stress characteristic that imparts a tensile stress in a range from about 2 gigapascals (2 GPa) to about 4 gigapascals (4 GPa) in the channel regions of the NMOS transistors.

4 Claims, 6 Drawing Sheets

U.S. PATENT DOCUMENTS

| | | |
|---|---|---|
| 2003/0040158 A1 | 2/2003 | Saitoh |
| 2004/0021160 A1 | 2/2004 | Eguchi et al. |
| 2005/0048732 A1 | 3/2005 | Park et al. |
| 2005/0093078 A1 | 5/2005 | Chan et al. |
| 2005/0098829 A1 | 5/2005 | Doris et al. |
| 2005/0199963 A1 | 9/2005 | Aoyama |
| 2005/0218455 A1 | 10/2005 | Maeda et al. |
| 2005/0230756 A1 | 10/2005 | Chang et al. |
| 2006/0011586 A1 | 1/2006 | Shea |
| 2006/0019438 A1 | 1/2006 | Harakawa |
| 2006/0046400 A1 | 3/2006 | Burbach et al. |
| 2006/0094193 A1 | 5/2006 | Horstmann et al. |
| 2006/0118879 A1 | 6/2006 | Li |
| 2007/0099360 A1 | 5/2007 | Lee et al. |
| 2007/0252230 A1 | 11/2007 | Zhu et al. |
| 2007/0257336 A1* | 11/2007 | Matsumoto ................. 257/627 |
| 2008/0026523 A1 | 1/2008 | Lee et al. |
| 2008/0050869 A1 | 2/2008 | Sudo |
| 2008/0073713 A1 | 3/2008 | Kim et al. |
| 2009/0101945 A1* | 4/2009 | Yamaguchi et al. ......... 257/288 |

FOREIGN PATENT DOCUMENTS

| | | |
|---|---|---|
| JP | 10-177938 | 6/1998 |
| JP | 2001-352055 A | 12/2001 |
| JP | 2003-60076 A | 2/2003 |
| JP | 2003-86704 A | 3/2003 |
| JP | 2003-273240 A | 9/2003 |
| JP | 2004-47608 A | 2/2004 |
| JP | 2004-128316 A | 4/2004 |
| JP | 2005-64314 A | 3/2005 |
| JP | 2006-80161 A | 3/2006 |
| JP | 2006-173432 | 6/2006 |
| JP | 2006-237070 | 9/2006 |
| JP | 2006237070 A | 9/2006 |
| KR | 10-1997-0018691 | 4/1997 |
| KR | 10-0183785 B1 | 12/1998 |
| KR | 1020010076522 A | 8/2001 |
| KR | 10-2002-0017845 A | 3/2002 |
| KR | 10-2002-0074551 A | 10/2002 |
| KR | 10-2003-0076354 A | 9/2003 |
| KR | 10-2004-0070794 A | 8/2004 |
| KR | 1020040107477 | 12/2004 |
| KR | 10-2005-0049243 A | 5/2005 |
| KR | 10-2006-0000912 A | 1/2006 |
| KR | 10-2006-0004595 A | 1/2006 |
| KR | 10-2006-0119773 A | 11/2006 |

* cited by examiner

METHODS OF FORMING CMOS INTEGRATED CIRCUITS THAT UTILIZE INSULATING LAYERS WITH HIGH STRESS CHARACTERISTICS TO IMPROVE NMOS AND PMOS TRANSISTOR CARRIER MOBILITIES

RELATED APPLICATIONS

This application is a divisional application of and claims priority to U.S. patent application Ser. No. 11/560,564, filed Nov. 16, 2006 now abandoned, the disclosure of which is hereby incorporated herein by reference as if set forth in its entirety.

FIELD OF THE INVENTION

The present invention relates to integrated circuit devices and methods of forming same and, more particularly, to CMOS integrated circuits and methods of forming same.

BACKGROUND OF THE INVENTION

Methods of forming CMOS integrated circuits may include processing steps that influence charge carrier mobility within PMOS and NMOS transistors. Some of these processing steps may increase charge carrier mobilities in the channel regions of the PMOS and NMOS transistors by stressing the channel regions. For example, the mobilities of the N-type charge carriers (i.e., electrons) within the channel regions of NMOS transistors may be increased by adding a tensile stress to the NMOS channel regions and the mobilities of the P-type charge carriers (i.e., holes) within the channel regions of PMOS transistors may be increased by adding a compressive stress to the PMOS channel regions.

Unfortunately, conventional semiconductor processing techniques typically do not yield NMOS and PMOS transistors having sufficiently stressed channel regions. For example, conventional semiconductor processing techniques may result in PMOS transistors having highly compressively stressed channel regions, but these techniques may result in NMOS transistors having channel regions with insufficient tensile stresses therein.

SUMMARY OF THE INVENTION

Embodiments of the present invention include CMOS integrated circuits having NMOS and PMOS transistors therein. Insulating layers are also provided to impart relatively large tensile stresses to the NMOS transistors and impart relatively large compressive stresses to the PMOS transistors. According to some of these embodiments, an NMOS transistor is provided in a semiconductor substrate and a first electrically insulating layer is formed on the NMOS transistor. This first electrically insulating layer is formed to have a sufficiently high internal stress characteristic that imparts a tensile stress in a range from about 2 gigapascals (2 GPa) to about 4 gigapascals (4 GPa) in the channel region of the NMOS transistor. These embodiments may also include a PMOS transistor and a second electrically insulating layer that is formed on the PMOS transistor. This second electrically insulating layer is formed to have a sufficiently high internal stress characteristic to impart a compressive stress in a range from about 2 gigapascals to about 4 gigapascals in a channel region of the PMOS transistor. According to additional aspects of these embodiments, the first and second electrically insulating layers may be formed of the same dielectric material, but under different processing conditions. This dielectric material may be one selected from a group consisting of SiN, SiON, SiCN, SiC and $SiO_2$ and combinations thereof.

Additional embodiments of the present invention include methods of forming integrated circuit devices by forming NMOS and PMOS transistors in a surface of a semiconductor wafer and depositing a first electrically insulating layer on the NMOS and PMOS transistors. This depositing step is performed while simultaneously bending the semiconductor wafer so that the surface has a concave shape. Portions of the first electrically insulating layer are then selectively removed from the PMOS transistors. This removal step is followed by a step of depositing a second electrically insulating layer on the PMOS transistors, while simultaneously supporting the semiconductor wafer so that the surface is substantially planar. The step of depositing the first electrically insulating layer may include bending the semiconductor wafer to a sufficient degree so that the first electrically insulating layer has a high internal tensile stress in a range from about 2 gigapascals to about 4 gigapascals when the surface is returned to a substantially planar condition.

BRIEF DESCRIPTION OF THE DRAWINGS

The above and other features and advantages of the present invention will become more apparent by describing in detail preferred embodiments thereof with reference to the attached drawings, in which.

DETAILED DESCRIPTION OF THE INVENTION

Figure 1:
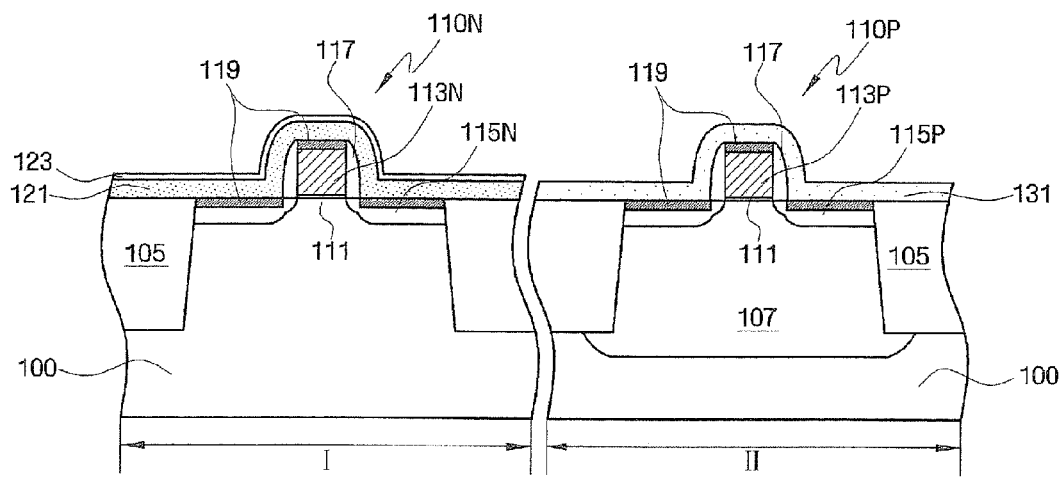
FIG. 1 is a cross-sectional diagram illustrating a semiconductor device according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Referring to FIG. 1, the semiconductor device according to an embodiment of the present invention includes an NMOS transistor 110N formed in an NMOS transistor-forming region I of a semiconductor substrate 100 and a PMOS transistor 110P formed in a PMOS transistor-forming region II. An active region of the semiconductor substrate 100 is defined by device isolation regions 105. Examples of the semiconductor substrate 100 include a substrate formed of one or more semiconductor materials selected from a group consisting of Si, Ge, SiGe, GaP, GaAs, SiC, SiGeC, InAs, and InP, or a silicon-on-insulator substrate (SOI substrate). Further, even though a P-type substrate is exemplified as the semiconductor substrate 100 in the following description, an N-type substrate is also available. A position of a well region can be changed in accordance with a conductive type of the substrate from the position illustrated in FIG. 1.

The NMOS transistor 110N disposed in the NMOS transistor region I includes a gate electrode 113N formed on a gate insulating layer 111 and a source/drain region 115N doped with an N-type impurity and formed on a portion of the substrate at both sides of the gate electrode 113N. Even though it is not illustrated, a P-type well may be formed in a portion of the semiconductor substrate 100 in the NMOS transistor region I, as necessary. The gate electrode 113N may be a single layer such as a polysilicon film, a metal film, or a lamination thereof. In this case, the polysilicon film may be a polysilicon region doped with an N-type impurity, but it is not limited thereto. The polysilicon film may have the same conductivity type as the gate electrode 113P of the PMOS transistor 110P, which is described hereinbelow.

A spacer 117 is disposed on a side wall of the gate electrode 113N, and a metal silicide film 119 may be formed on the gate electrode 113N and on the source/drain regions 115N. Metal components of the metal silicide film 119 may include Co, Ni, Ti, Ta, or W, but are not limited thereto.

A tensile stress film 121 is disposed on the NMOS transistor 110N to apply a tensile stress to the channel region of the NMOS transistor 110N. The tensile stress film 121 applies a tensile stress to the channel region of the NMOS transistor 110N in order to increase the mobility of N-type carriers (i.e., electrons) therein. In this case, the tensile stress may be approximately 2 to 4 Gpa. Even though it is preferable that the tensile stress be large to increase carrier mobility, when the tensile stress exceeds 4 GPa, the stress may degrade the substrate characteristics and possibly crack the substrate. Examples of tensile stress films 121 include SiN, SiON, SiC, SiCN, SiO$_2$ or combinations thereof, however, other materials may also be used. The thickness of the tensile stress film 121 may be in a range between 50 to 1000 Å.

The PMOS transistor 110P disposed in the PMOS transistor region II includes a gate electrode 113P formed on the gate insulating layer 111, and a source/drain region 115P doped with a P-type impurity and formed on a portion of the substrate at both sides of the gate electrode 113P. Reference numeral 107 denotes an N-type well that is formed in a portion of the substrate 100 in the PMOS transistor region II. The gate electrode 113P may be a single layer such as a polysilicon film, a metal film, or a lamination thereof. In this case, the polysilicon film may be a polysilicon region that is doped with a P-type impurity, however, other dopants may also be used. Even though the conductivity types of the gate electrode 113N of the NMOS transistor 110N and the gate electrode 113P of the PMOS transistor 110P are preferably different from each other, the conductivity types of the gate electrodes may be the same in other embodiments of the invention.

A spacer 117 is disposed on a side wall of the gate electrode 113P, and a metal silicide film 119 may be formed on the gate electrode 113P and the source/drain region 115P. Metal components of the metal silicide film 119 may include Co, Ni, Ti, Ta, or W, but are not limited thereto.

A compressive stress film 131 is disposed on the PMOS transistor 110P to apply a compressive stress to the channel region of the PMOS transistor 110P. The compressive stress film 131 applies a compressive stress to the channel region of the PMOS transistor 110P in order to increase the mobility of P-type carriers (i.e., holes) therein. In this case, the compressive stress may be approximately 2 to 4 Gpa. Even though it is preferable that the compressive stress be large in order to increase hole mobility, if the compressive stress exceeds 4 GPa, then the stress may degrade the electrical characteristics of the substrate 100 and possibly even crack the substrate 100. Examples of compressive stress films 131 include SiN, SiON, SiC, SiCN, SiO$_2$ or combinations thereof, however, other materials may also be used. The thickness of the compressive stress film 131 may be in a range between 50 to 1000 Å.

The stress that is applied by each of the stress films can be calculated by the following equation. The equation can obtain a strength of the tensile stress or the compressive stress by measuring a curvature of the substrate 100 using measuring equipment such as FLX-2320.

$$\sigma = [E/(1-v)][h^2/6Rt],\qquad \text{Equation 1}$$

(wherein $\sigma$ is a stress of a stress film (Pa), $E/(1-v)$ is a biaxial elastic modulus of a substrate, h is a thickness of the substrate, t is a thickness of the stress film, R is a radius of the curvature of the substrate, v is the Poisson's ratio and E is the elastic modulus.

Referring still to FIG. 1, an etch stop layer 123 is positioned on the tensile stress film 121 in the NMOS transistor region I. A low temperature oxide (LTO) film can be used as the etch stop layer 123, but other materials may also be used.

Figure 2:
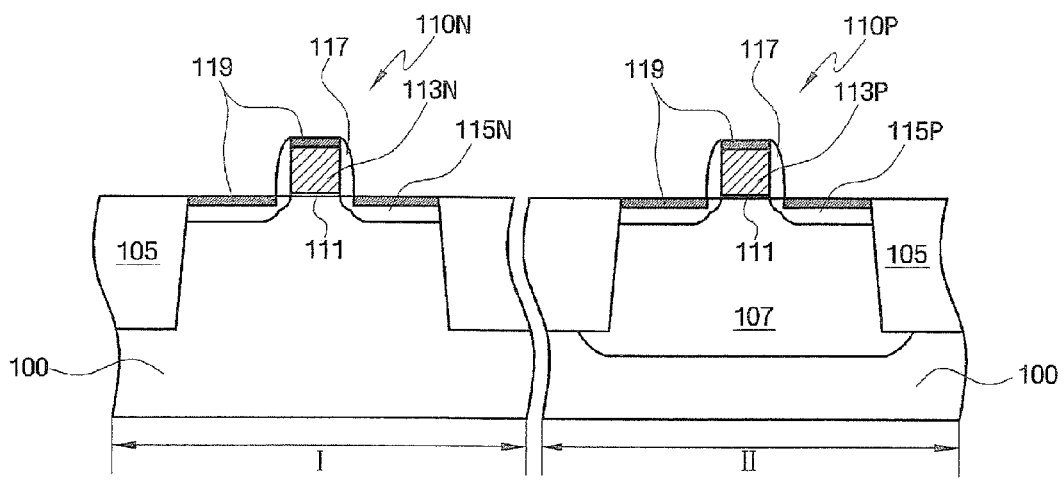
FIGS. 2 to 6 are diagrams illustrating methods of fabricating the semiconductor devices according to embodiments of the present invention.

FIGS. 2 to 6 are sectional views illustrating a method of fabricating a semiconductor device according to the embodiment of FIG. 1. Referring to FIG. 2, a substrate on which a PMOS transistor and an NMOS transistor are to be formed is prepared. More specifically, a LOCOS process (local oxidation of silicon) or an STI (shallow trench isolation) process is performed on a predetermined region of the semiconductor substrate 100 to form a device isolation film 105. A well region is formed in the NMOS transistor region I and/or the PMOS transistor region II. For example, when using a P-type substrate, an n-type impurity is injected into the PMOS transistor region II to form an n well 107. Even though it is not illustrated, a p-type impurity can be injected into the NMOS transistor region I to form a p-well having a concentration that is larger than that of the P-type substrate 100.

Thereafter, a gate insulating layer and a conductive layer for a gate electrode are formed on the entire semiconductor substrate 100 and then patterned to form gate electrodes 113N and 113P. In this case, the gate insulating layer 111 may be formed of an oxide film and the gate electrodes 113N and 113P may be formed of a single layer such as a polysilicon film or a metal film doped with impurities having the same conductivity type or different conductivity types, or a lamination thereof.

Subsequently, a photo resist pattern is formed to expose the NMOS transistor region I and an n-type impurity is injected at both sides of the gate electrode 113N to form source/drain regions 115N. Then, the photo resist pattern that exposes the NMOS transistor region I is removed, and another photo resist pattern that exposes the PMOS transistor region II is formed to form source/drain regions 115P at both sides of the gate electrode 113 in the PMOS transistor region II. The above source/drain regions 115P may have a DDD (double diffused drain) or an LDD (lightly doped drain) structure. An insulating layer such as a silicon nitride film is formed on the entire region and then anisotropically etched to form spacers 117 at both sides of the gate electrodes 113N and 113P. Thereafter, highly doped impurity regions are formed to define source/drain regions 115N and 115P having a LDD structure. According to the above process, an NMOS transistor 110N and a PMOS transistor 110P respectively having gate electrodes 113N and 113P and source/drain regions 115N and 115P in predetermined regions of the semiconductor substrate 100 are completed.

A silicide metal film is then deposited on the entire semiconductor substrate 100 on which the NMOS transistor and the PMOS transistor 110N and 110P are formed. This metal film is heated to form a metal silicide film 119 on the gate electrodes 113N and 113P and on the source/drain regions 115N and 115P.

Figure 3:
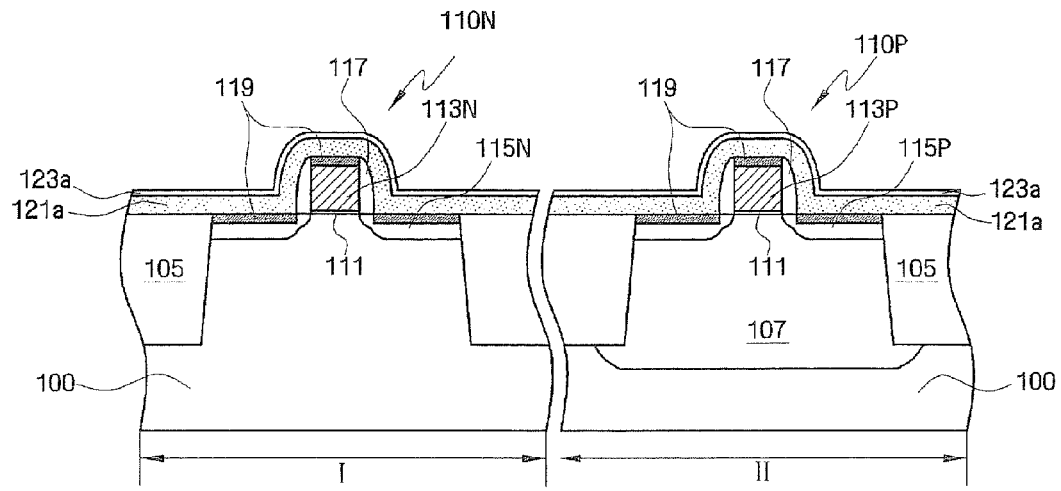
Figure 4:
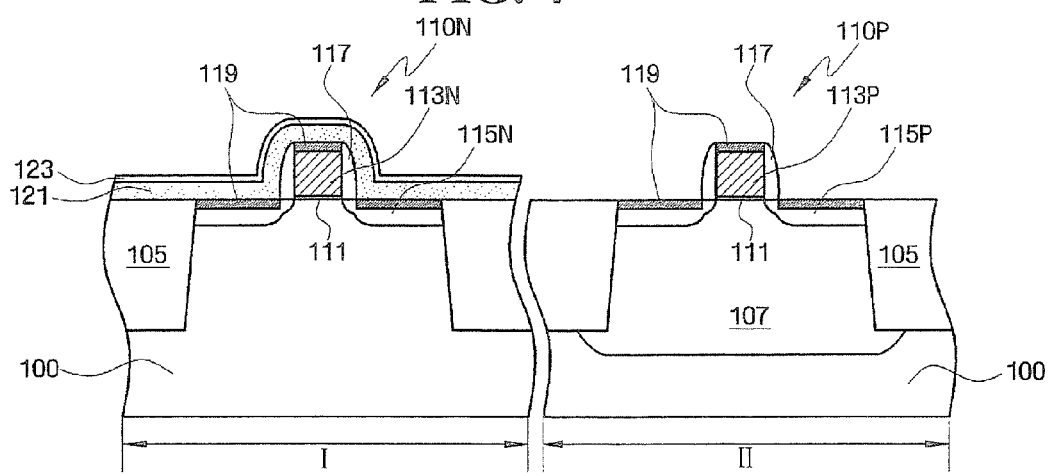

As illustrated in FIGS. 3 and 4, the tensile stress film 121 is formed on the NMOS transistor 110N. Specifically, the semiconductor substrate 100 on which the NMOS transistor 110N and the PMOS transistor 110P are formed is fixed onto a chuck in a process chamber in an apparatus for fabricating a semiconductor device that performs a tensile stress film forming process. The fixation of the semiconductor substrate 100 is performed so as to maintain a concave top surface.

Next, as illustrated in FIG. 3, a tensile stress film 121a is formed using a CVD method such as a thermal CVD, PECVD, or a high density plasma CVD, to cover the transistors 110N and 110P. The thickness and the material of the tensile stress film 121a are same as in FIG. 1. For example, in order to form the tensile stress film 121a made of SiN, a silicon source gas such as $SiH_4$ and a nitrogen source gas such as $NH_3$, $N_2$, can be used as source gases. The deposition process can be performed at a temperature of 300 to 600° C. and a pressure of 1 to 10 torr.

Meanwhile, an etch stop layer 123a may be formed on the tensile stress film 121a in the same process chamber. The etch stop layer 123a can be formed of an LTO film, as mentioned above. Subsequently, the semiconductor substrate 100 with the tensile stress film 121a formed thereon is removed from the chuck of the apparatus for fabricating a semiconductor device and then cooled. The cooling process is performed in a loadlock chamber that is separately provided from the apparatus for fabricating the semiconductor device.

Next, as illustrated in FIG. 4, portions of the tensile stress film 121 and the etch stop layer 123a that are formed beyond the NMOS transistor region I are removed such that the tensile stress film 121 and the etch stop layer 123 remain only in the NMOS transistor region I. In this case, a mask pattern (not illustrated) is used to selectively expose the PMOS transistor region II. The process of removing the tensile stress film 121a and the etch stop layer 123a is performed by using a dry method or a wet method which is generally used in the art.

Therefore, in the embodiment of the present invention, according to the process of forming the tensile stress film 121, the semiconductor substrate 100 is fixed so as to manually maintain a concave top surface and then the tensile stress film 121 is formed on the substrate 100. Therefore, the tensile stress is larger than the case where the tensile stress film is formed on a flat surface. The reason is that when an external force presses the semiconductor substrate to form a concave surface and then the external force is removed from the substrate, the substrate is restored in a direction opposite to the external force, that is, a direction that makes the substrate flat. Therefore, the tensile stress is increased when the external force is removed. As described above, according to an exemplary embodiment of the present invention, the tensile stress film 121, which has an internal tensile stress of approximately 2 to 4 gigapascals, is formed in the NMOS transistor region I.

The tensile stress film 121a formed as described above can apply a large tensile stress into the channel region of the NMOS transistor 110N to improve the mobility of N-type carriers (i.e., electrons) in the channel region of the NMOS transistor 110N. Therefore, the performance of the NMOS transistor 110N is improved by providing a tensile stress to the channel region of the NMOS transistor 110N.

Figure 5:
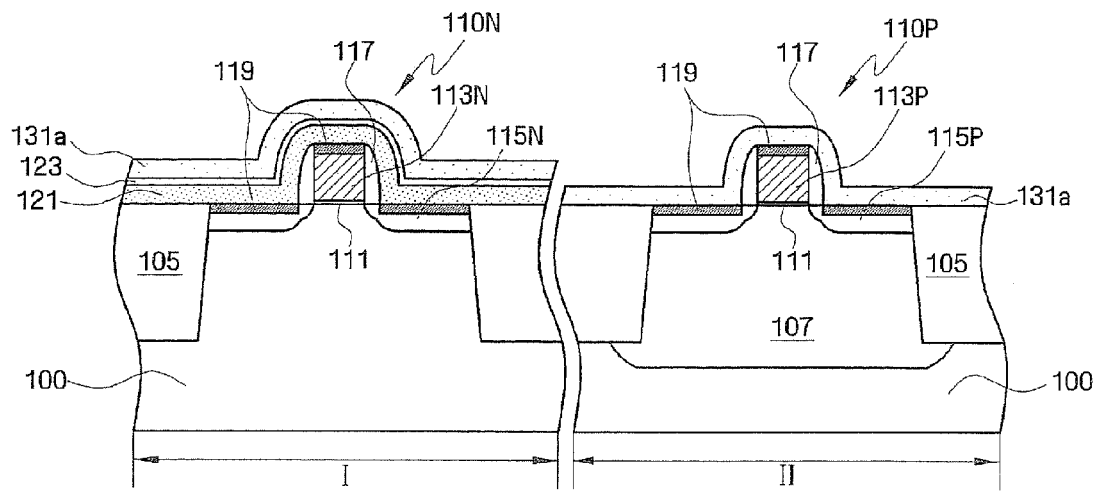
Figure 6:
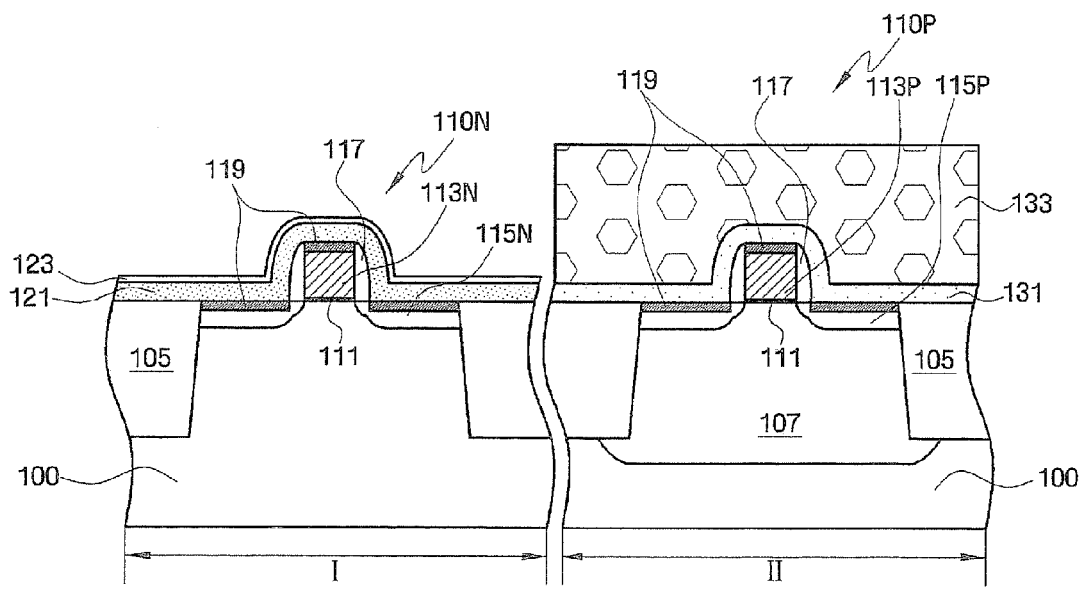

Referring now to FIGS. 5 and 6, a compressive stress film 131a is formed on the entire substrate using a CVD method such as a thermal CVD, PECVD, and high density plasma CVD. The thickness and the materials of the compressive stress film 131a are the same as in FIG. 1. The compressive stress film 131a may also be formed on a previously formed NMOS transistor region I, that is, on the tensile stress film 121 and the etch stop layer 123.

Subsequently, as illustrated in FIG. 6, a mask pattern 133, which selectively exposes the NMOS transistor region I, is formed, and then a portion of the compressive stress film 131a that is formed beyond the PMOS transistor region II is removed so that the compressive stress film 131 remains only in the PMOS transistor region II. In this case, the process of removing the compressive stress film is performed using a dry etch method or a wet etch method. Thereafter, the mask pattern 133 may be removed by an etching process or an ashing process.

Accordingly, the semiconductor device as illustrated in FIG. 1 having the tensile stress film 121 formed on the NMOS transistor region I and the compressive stress film 131 formed on the PMOS transistor region II can be fabricated. The tensile stress film 121 and the compressive stress film 131 have approximately 2 to 4 GPa of tensile stress and compressive stress, respectively.

Although the process of forming the tensile stress film 121 is performed prior to the process of forming the compressive stress film 131, the compressive stress film 131 may be formed before forming the tensile stress film 121 in alternative embodiments of the invention.

Figure 7:
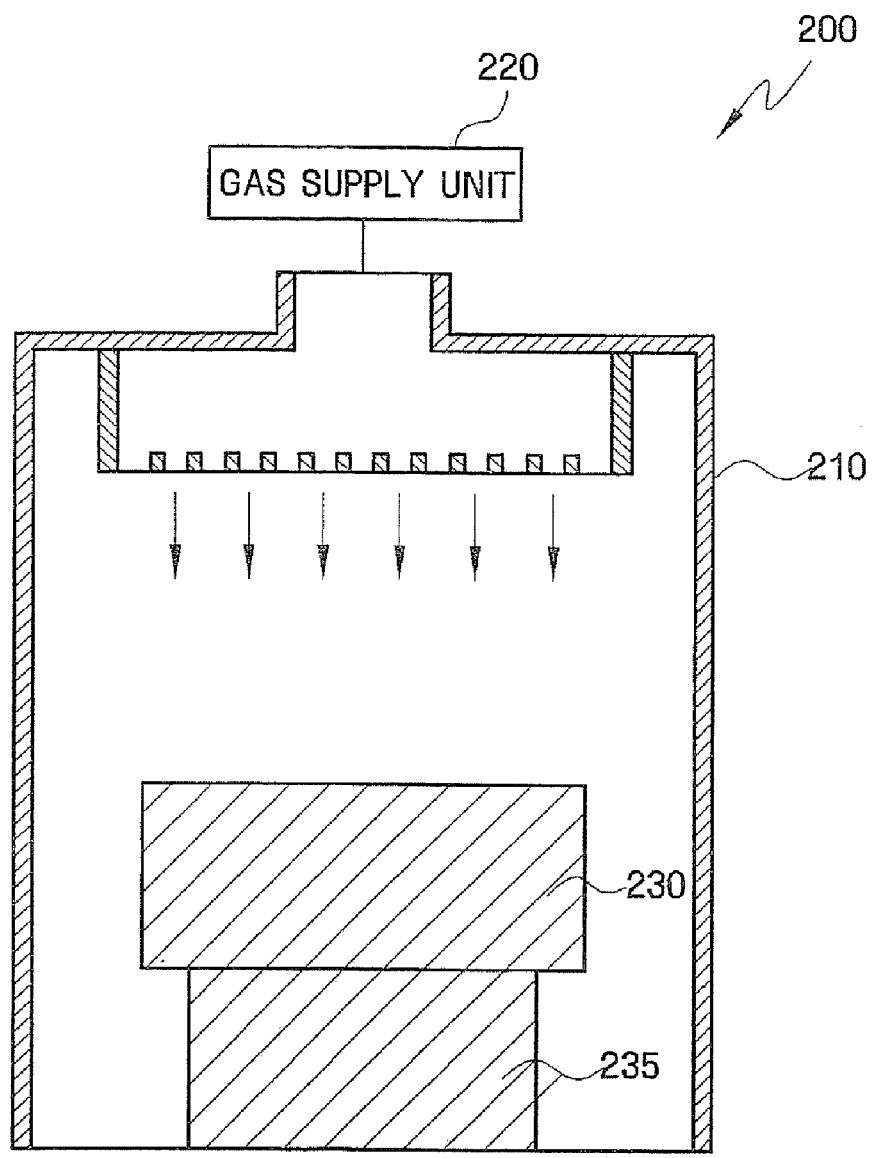
FIG. 7 is a schematic diagram illustrating a section of an apparatus for fabricating semiconductor devices according to embodiments of the present invention.
Figure 8:
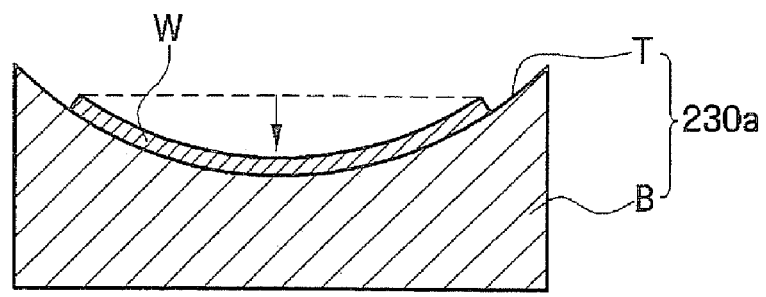
FIG. 8 is a cross-sectional diagram illustrating a chuck provided in the apparatus of FIG. 7.
Figure 9A:
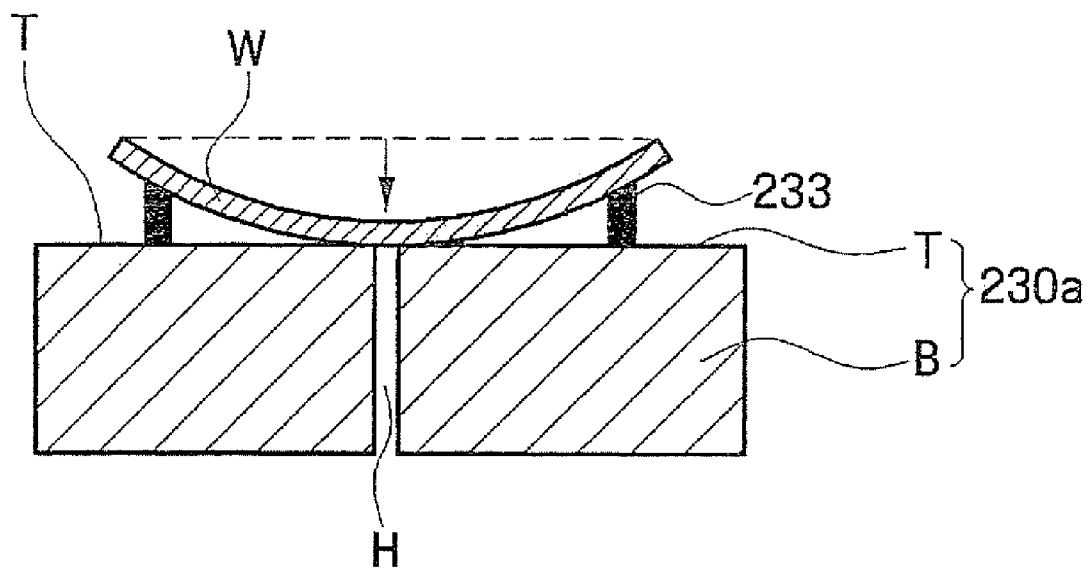
FIGS. 9A to 9C are cross-sectional and plan views that illustrate an alternative chuck that may be used in the apparatus of FIG. 7.
Figure 9B:
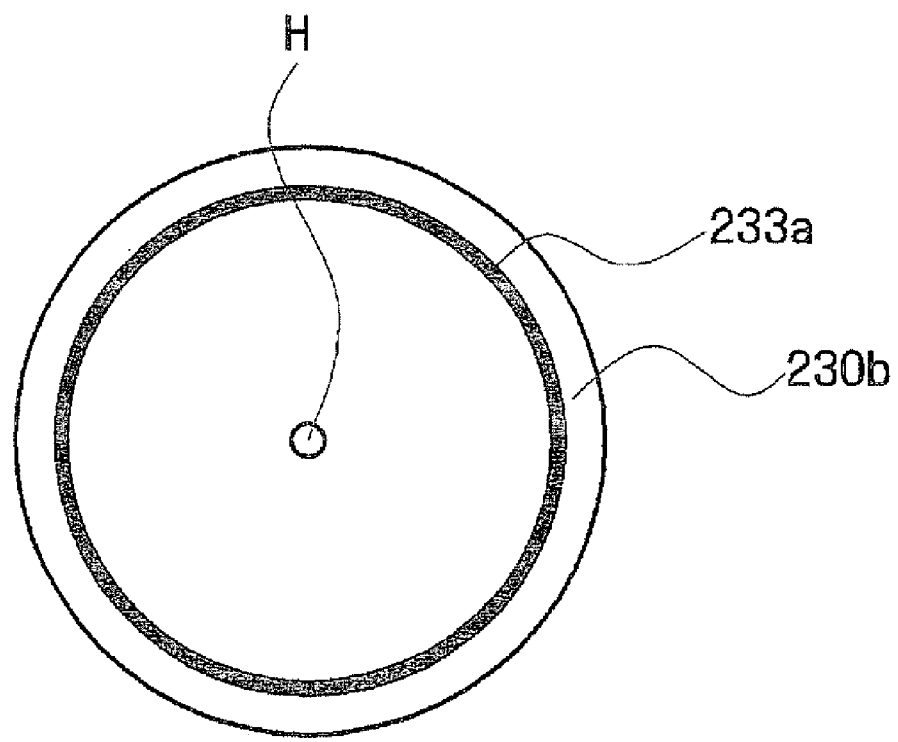
Figure 9C:
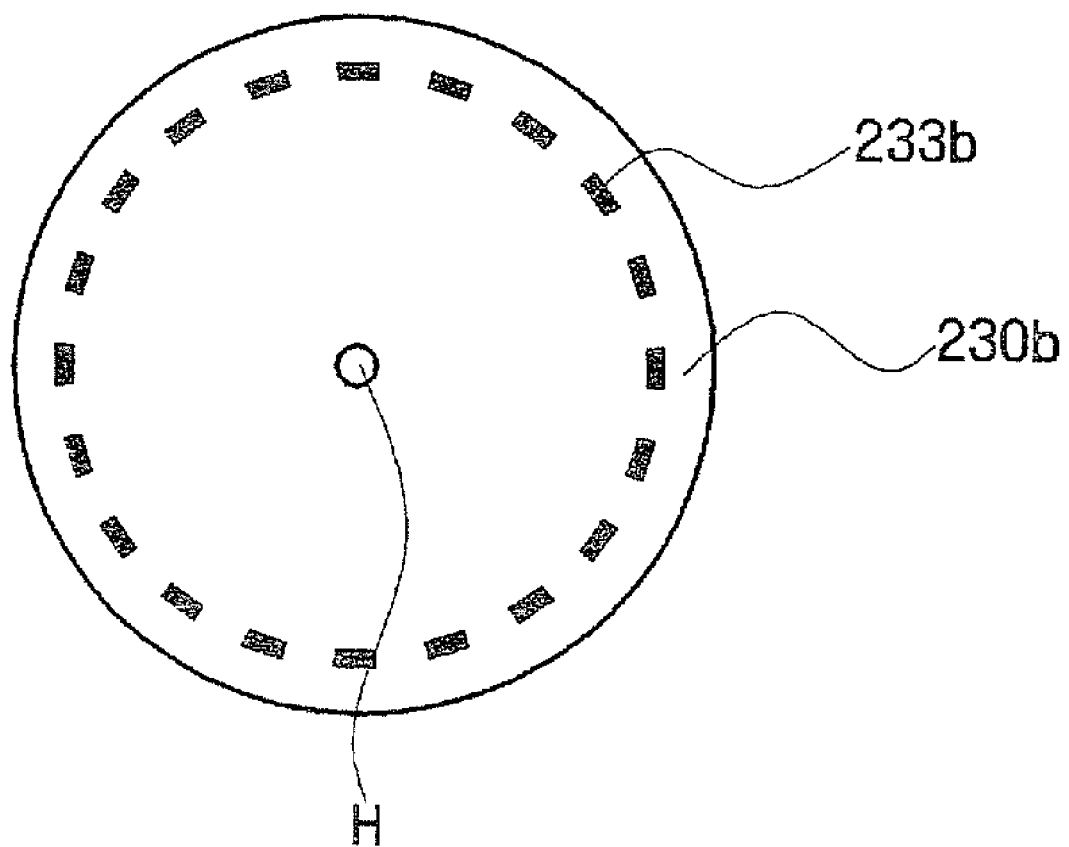

Referring to FIGS. 7 to 9C, an apparatus for fabricating the above-described semiconductor devices will be described. FIG. 7 is a cross-sectional diagram schematically illustrating a part of an apparatus for fabricating the semiconductor device according to an embodiment of the present invention. FIG. 8 is a cross-sectional diagram illustrating a chuck provided in the apparatus for fabricating the semiconductor device according to an embodiment of the present invention. FIGS. 9A to 9C are cross-sectional and plan views illustrating a chuck provided in the apparatus for fabricating the semiconductor device according to another embodiment of the present invention.

Referring to FIG. 7, a semiconductor device fabricating apparatus 200 includes a process chamber 210 and a chuck 230. The process chamber 210 performs a process of forming a tensile stress film that applies a tensile stress of 2 to 4 GPa to a channel of an NMOS transistor provided in the semiconductor substrate. The film forming process in the process chamber 210 is performed by using a CVD method such as a thermal CVD, a PECVD, or a high density plasma CVD process. An appropriate temperature and an appropriate pressure are maintained to perform the CVD method. A film forming gas may be supplied to the process chamber 210 through a gas supply unit 220.

A semiconductor substrate on which a film is to be formed, a wafer is fixed to the chuck 230. The semiconductor substrate is fixed to the chuck with a concave top surface. The chuck 230 may be an electrostatic chuck that uses static electricity in order to clamp the semiconductor substrate or a vacuum chuck that uses a vacuum. The top surface of the semiconductor substrate disposed on the upper portion of the chuck 230 can maintain a concave shape by static electricity or vacuum generated by the chuck 230.

When the chuck 230 is an electrostatic chuck, a lower portion of the chuck 230 is connected to a lower electrode (not illustrated) and a lower surface of the lower electrode is connected to a chuck support 235. The lower electrode is connected to a lower power source through the inside of the chuck support 235 to supply a power source. A coolant flows inside the lower electrode to maintain an appropriate temperature of the chuck 230.

Further, when the chuck 230 is a vacuum chuck, one or more vacuum holes (not illustrated), which pass through the inside of the chuck 230 from the top surface of the chuck 230, suck air through a vacuum line or a pump connected to the vacuum hole. The vacuum hole can be disposed at the center of the chuck 230 or a portion that is capable of satisfactorily fixing the semiconductor substrate.

The chuck support 235 is disposed below the chuck 230. A cylinder (not illustrated) that adjusts the height of the chuck using a pneumatic pressure is provided inside the chuck support 235. The cylinder (not illustrated) moves the electrostatic chuck 230 in a vertical direction to move the semiconductor substrate in the vertical direction. The chuck 230 that allows the semiconductor substrate to have a concave top surface can be realized as illustrated in FIGS. 8 and 9A, but it is not limited thereto.

As illustrated in FIG. 8, the top surface T of the chuck body B is curved to fix the semiconductor substrate W with a concave top surface. That is, the center of the chuck body B is deeper than the other portion. Therefore, when the semiconductor substrate W is fitted to the concave top surface T by static electricity or vacuum, the top surface of the semiconductor substrate W is curved so as to have the same shape as the chuck body B.

Hereinafter, the vacuum chuck is exemplified as a chuck including a protrusion with reference to FIGS. 9A to 9C. However, as described above, it is a matter of course that in addition to the vacuum chuck, the electrostatic chuck can be used in the embodiments of the present invention. Therefore, the embodiment of the present invention is not limited to only one of the vacuum chuck and the electrostatic chuck.

As illustrated in FIG. 9A, a protrusion 233 is formed on the top surface T of the chuck body B to have a predetermined height. The protrusion 233 is positioned at the edge of the chuck body B to support the edge of the semiconductor substrate W. In this case, the top surface of the chuck body B may be concave or flat. The protrusion 233 may be a plurality of pins or a ring. The protrusion 233 supports the edge of the semiconductor substrate W to cause the semiconductor substrate W to be higher than the top surface of the chuck body B. The center of the semiconductor substrate W is drawn toward the chuck by the static electricity or the vacuum to maintain the concave top surface of the semiconductor substrate W. Therefore, the height and the position of the protrusion 233 are determined by taking into consideration of the curvature of the semiconductor substrate W.

As illustrated in FIG. 9A, a vacuum hole H is formed through the center of the chuck body B and the center of the semiconductor substrate W is fixed to the chuck body B on the basis of the vacuum condition that is applied to the vacuum hole H. Therefore, since the edge of the semiconductor substrate W is supported by the protrusion 233 and the center of the semiconductor substrate W is fixed close to the chuck body B, the semiconductor substrate W can have a concave top surface. In this case, even though only one vacuum hole H that passes through the center of the chuck body B is exemplified, the position or the number of the vacuum holes can be varied within the purpose of the present invention. The protrusion may be a ring 233a as illustrated in FIG. 9B or a plurality of pins 233b as illustrated in FIG. 9C.

The operation of the apparatus for fabricating the semiconductor device will be described with reference to FIGS. 7 to 9C. First, a semiconductor substrate on which films are to be formed, is positioned on the chuck 230 in the process chamber 210 by a substrate-transferring unit such as a robot arm. The top surface of the semiconductor substrate W is flat until a vacuum or static electricity is applied thereto. Subsequently, when applying the vacuum or the static electricity, the top surface of the semiconductor substrate becomes concave. In this state, a tensile stress film is formed in the semiconductor substrate W. After completing the tensile stress film, the semiconductor substrate is separated from the chuck 230 by removing the vacuum or the static electricity and then cooled before performing the following processes. The cooling process is performed in a loadlock chamber provided in the apparatus for fabricating a semiconductor device.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit device, comprising the steps of:
    forming NMOS and PMOS transistors in a surface of a semiconductor wafer;
    depositing a first electrically insulating layer on the NMOS and PMOS transistors and the surface while simultaneously bending the semiconductor wafer so that the surface has a concave shape;
    selectively removing portions of the first electrically insulating layer from the PMOS transistors; and
    depositing a second electrically insulating layer directly on the PMOS transistors and the surface while simultaneously supporting the semiconductor wafer so that the surface is substantially planar.

2. The method of claim 1, wherein the first and second electrically insulating layers comprise the same dielectric material.

3. The method of claim 2, wherein the first electrically insulating layer is a dielectric material selected from a group consisting of SiN, SiON, SiCN, SiC and $SiO_2$ and combinations thereof.

4. A method of forming an integrated circuit device, comprising the steps of:
    forming NMOS and PMOS transistors in a surface of a semiconductor wafer;
    depositing a first electrically insulating layer on the NMOS and PMOS transistors and the surface while simultaneously bending the semiconductor wafer so that the surface has a concave shape;
    selectively removing portions of the first electrically insulating layer from the PMOS transistors; and
    depositing a second electrically insulating layer directly on the PMOS transistors;
    wherein said step of depositing a first electrically insulating layer comprises bending the semiconductor wafer to a sufficient degree so that the first electrically insulating layer has an internal tensile stress in a range from about 2 gigapascals to about 4 gigapascals when the surface is returned to a substantially planar condition.

* * * * *